(12) United States Patent
Ju

(10) Patent No.: US 9,439,298 B2
(45) Date of Patent: Sep. 6, 2016

(54) ELECTRICAL CONNECTOR

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 309 days.

(21) Appl. No.: 14/181,412

(22) Filed: Feb. 14, 2014

(65) Prior Publication Data

US 2015/0163897 A1 Jun. 11, 2015

(30) Foreign Application Priority Data

Dec. 5, 2013 (CN) .................... 2013 2 0791167 U

(51) Int. Cl.
*H05K 1/02* (2006.01)
*H05K 1/09* (2006.01)
*H05K 1/11* (2006.01)
*H05K 1/18* (2006.01)
*H05K 3/32* (2006.01)
*H01R 13/03* (2006.01)
*H01R 13/24* (2006.01)
*H01L 23/498* (2006.01)
*H01L 23/00* (2006.01)

(52) U.S. Cl.
CPC ........... *H05K 3/32* (2013.01); *H01L 23/49827* (2013.01); *H01L 23/49883* (2013.01); *H01L 24/81* (2013.01); *H01R 13/035* (2013.01); *H01L 23/49811* (2013.01); *H01L 24/13* (2013.01); *H01L 24/16* (2013.01); *H01L 2224/13111* (2013.01); *H01L 2224/16235* (2013.01); *H01L 2224/819* (2013.01); *H01L 2224/81101* (2013.01); *H01L 2224/81405* (2013.01); *H01L 2224/81411* (2013.01); *H01L 2224/81494* (2013.01); *H01L 2224/81505* (2013.01); *H01L 2224/81594* (2013.01); *H01L 2224/81691* (2013.01); *H01L 2224/81711* (2013.01); *H01R 13/2414* (2013.01); *H05K 2201/0314* (2013.01); *H05K 2201/10378* (2013.01); *H05K 2201/10674* (2013.01); *H05K 2201/10962* (2013.01)

(58) Field of Classification Search
CPC ................ H01R 13/035; H01L 24/81; H01L 23/49883; H05K 3/32
USPC ................... 174/251, 257, 258, 262; 361/783
See application file for complete search history.

(56) References Cited

U.S. PATENT DOCUMENTS

| | | | | |
|---|---|---|---|---|
| 4,740,657 A * | 4/1988 | Tsukagoshi | .............. | H01B 1/22 174/84 R |
| 5,977,490 A * | 11/1999 | Kawakita | ................ | H01B 1/22 174/255 |
| 6,545,363 B2 * | 4/2003 | Maruyama | ......... | G01R 1/06711 257/773 |
| 6,774,306 B2 * | 8/2004 | Smith | ................... | H01L 21/563 174/541 |
| 7,585,174 B2 * | 9/2009 | Ju | ...................... | H01R 13/2414 439/66 |
| 8,723,049 B2 * | 5/2014 | Woychik | ........... | H01L 21/76898 174/261 |

(Continued)

*Primary Examiner* — William H Mayo, III
*Assistant Examiner* — Hiram E Gonzalez
(74) *Attorney, Agent, or Firm* — Locke Lord LLP; Tim Tingkang Xia, Esq.

(57) ABSTRACT

An electrical connector for electrically connecting a first electronic element to a second electronic element includes an insulating body and multiple conductors. The insulating body has multiple accommodating holes. Each conductor is accommodated in a corresponding accommodating hole. Each conductor has an elastic insulator and low melting point liquid metal wrapping a surface of the elastic insulator, such that a continuous conducting path is formed by the liquid metal between the first electronic element and the second electronic element.

19 Claims, 6 Drawing Sheets

(56) References Cited

U.S. PATENT DOCUMENTS

2005/0133900 A1* 6/2005 Smith .................. H01L 21/563 257/688

2006/0274510 A1* 12/2006 Nakada ................ H05K 3/4069 361/748

* cited by examiner

ELECTRICAL CONNECTOR

CROSS-REFERENCE TO RELATED APPLICATION

This non-provisional application claims priority under 35 U.S.C. §119(a) on Patent Application No. 201320791167.5 filed in P.R. China on Dec. 5, 2013, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates generally to an electrical connector, and more particularly to an electrical connector for electrically connecting a chip module to a circuit board.

BACKGROUND OF THE INVENTION

An existing electrical connector such as that described in Chinese Patent No. CN200620059085.1 is used for electrically connecting a chip module to a circuit board. This electrical connector includes an insulating body having several accommodating holes and conductors accommodated in the accommodating holes. The conductor includes an elastomer. A surface of the elastomer is plated with a metal layer made of copper, nickel, or gold in a physical coating manner or other coating manners. An electrical path between the chip module and the circuit board is implemented by use of the metal layer over the surface of the elastomer. The foregoing metal layer made of copper, nickel or gold is hard, and when the conductor is pressed by the chip module, a crack is extremely easily generated on the metal layer, resulting in disconnection of the electrical path on the surface of the elastomer, and affecting the electrical connection between the chip module and the circuit board.

Therefore, a heretofore unaddressed need exists in the art to address the aforementioned deficiencies and inadequacies.

SUMMARY OF THE INVENTION

In one aspect, the present invention is directed to an electrical connector that ensures a stable electrical connection path between a chip module and a circuit board.

In one embodiment, an electrical connector for electrically connecting a first electronic element to a second electronic element includes an insulating body provided with multiple accommodating holes. A conductor is accommodated in each of the accommodating holes. The conductor includes an elastic insulator and low melting point liquid metal wrapping a surface of the elastic insulator. A continuous conducting path is formed by the liquid metal between the first electronic element and the second electronic element.

In one embodiment, the elastic insulator is a silicon rubber particle. The liquid metal is coated on the surface of the elastic insulator to form the conducting path. Each conductor includes multiple elastic insulators. A surface of each of the elastic insulators is wrapped by the liquid metal, and liquid metal on surfaces of all the elastic insulators of each conductor is in communication with each other.

In one embodiment, the conductor is made of a foaming material immersed with the liquid metal. An internal interval of the foaming material is filled with the liquid metal. The liquid metal wrapping a surface of the foaming material are in communication with the internal liquid metal. Specifically, the foaming material may be foam or foaming silica gel.

In one embodiment, at least one surface of the insulating body is covered by a covering layer. At least one perforation is formed on a location of the covering layer corresponding to the accommodating hole, and a diameter of the at least one perforation is less than a diameter of the accommodating hole. A part of the liquid metal is exposed from the perforation to contact the first electronic element or the second electronic element. A diameter of the elastic insulator is greater than the diameter of the perforation.

In one embodiment, the melting point of the liquid metal is less than 40° C. In one embodiment, the liquid metal is gallium metal or a gallium alloy.

In one embodiment, the conductor is in compression contact with the first electronic element and the second electronic element respectively.

In one embodiment, the surface of the elastic insulator is provided with a metal layer easily immersed by the liquid metal, and the liquid metal is disposed on a surface of the metal layer. The metal layer is a tin layer.

In one embodiment, the elastic insulator has at least one through-hole, and a conducting path is formed by the liquid metal through the through-hole.

In one embodiment, the surface of the elastic insulator is rough. The surface of the elastic insulator is provided with a groove or a cavity.

In one embodiment, a conducting substance is doped in the elastic insulator. The conducting substance is capable of forming an alloy with gallium.

In one embodiment, one end of the accommodating hole is provided with a tapering hooking portion, and the hooking portion is hooked to the conductor.

In one embodiment, the elastic insulator protrudes from at least one surface of the insulating body. The size of a protruding portion of the elastic insulator is greater than that of an opening of the accommodating hole.

As compared with the related art, in certain embodiments of the present invention, the low melting point liquid metal is disposed on the surface of the elastic insulator. The continuous conducting path is formed between the first electronic element and the second electronic element through the liquid metal. It is ensured that the conductor has good elasticity, and further, the phenomenon that the conducting path is disconnected due to being pressed by the chip module may be avoided, so as to ensure the stable electrical connection between the chip module and the circuit board. Moreover, electrical transmission is performed by the use of the liquid metal, the impedance of the liquid metal is small, which can effectively reduce the impedance of the electrical connector, so as to ensure normal current transmission, and provide a clear and stable communication effect.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
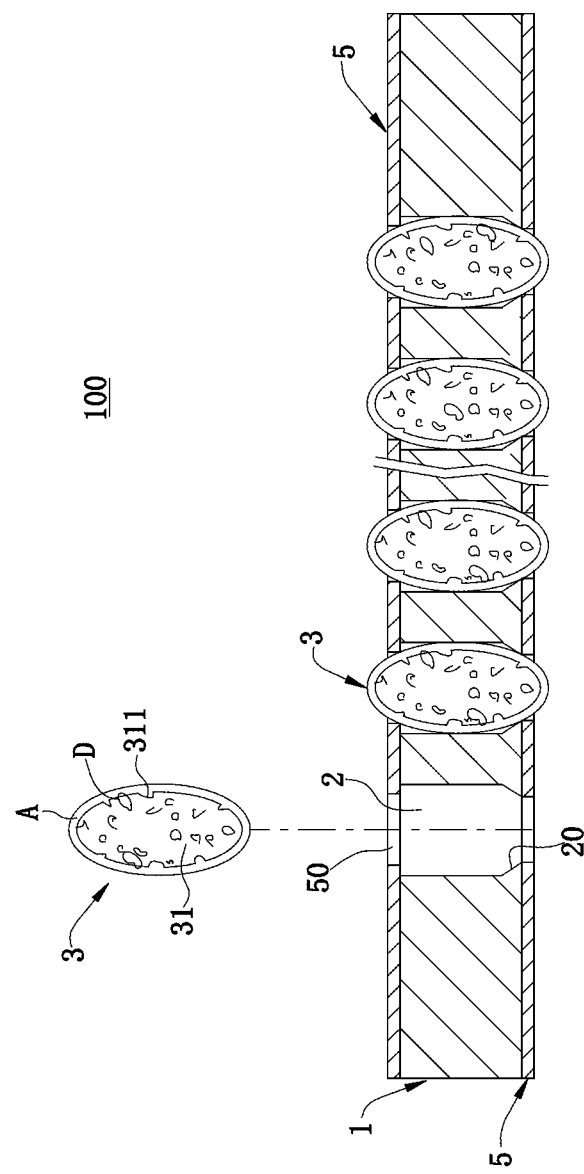
FIG. 1 is a schematic diagram of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

Figure 2:
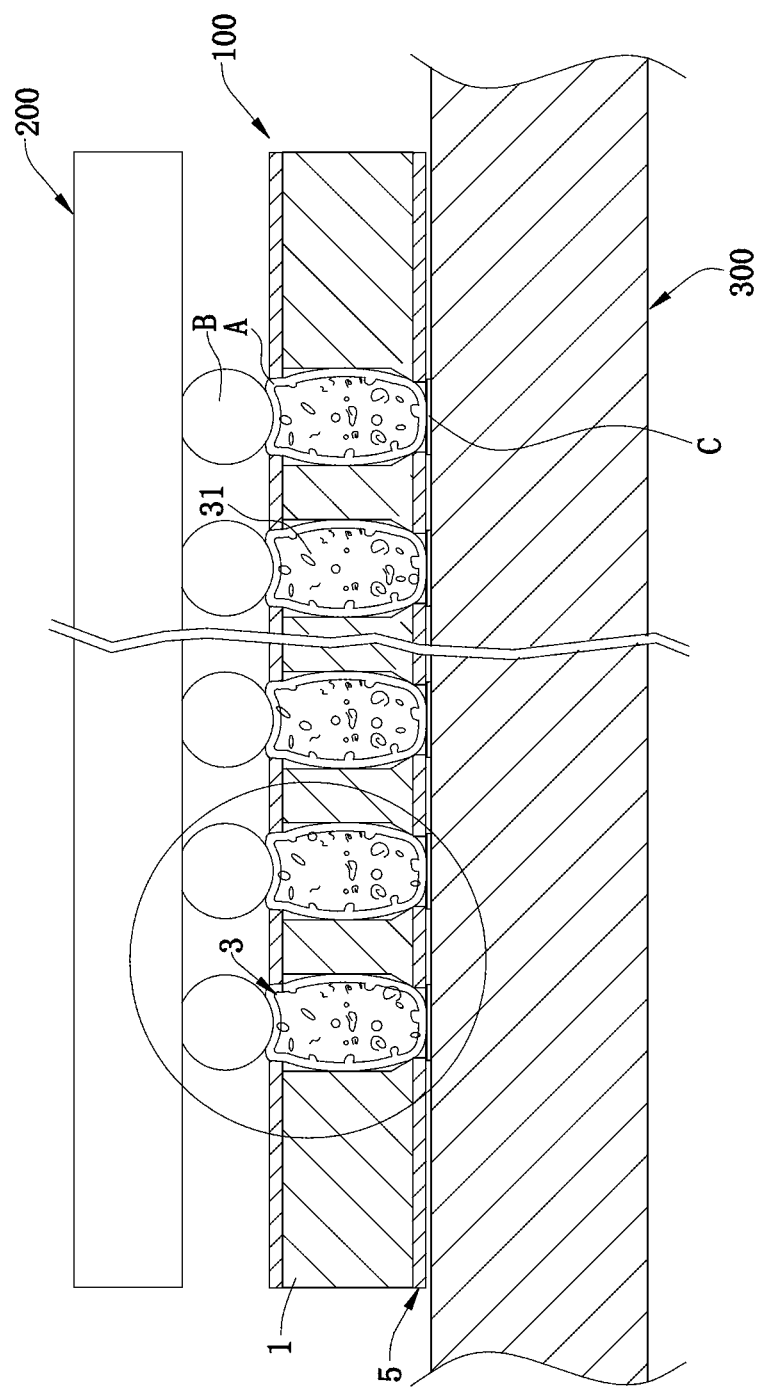
FIG. 2 is a schematic diagram when the electrical connector in FIG. 1 is connected to a circuit board and a chip module.
Figure 3:
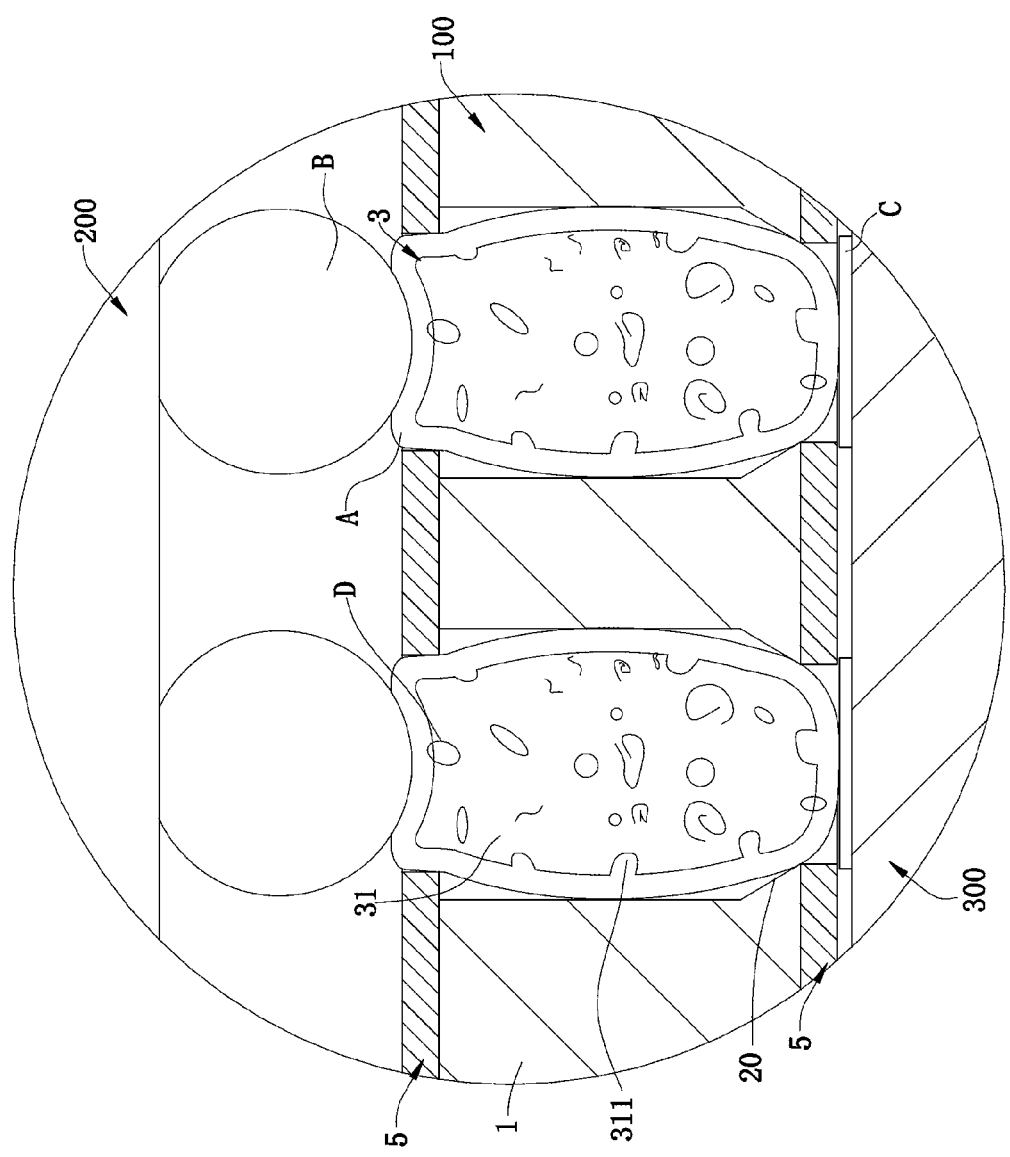
FIG. 3 is an enlarged view of a circled part of FIG. 2.

FIGS. 1-3 show one embodiment of the present invention. Referring to FIGS. 1-3, an electrical connector 100 is used for electrically connecting a chip module 200 to a circuit board 300. A bottom of the chip module 200 is provided with a tin ball B. A top of the circuit board 300 is provided with a conducting pad C. Alternatively, the bottom of the chip module 200 may also be provided with a conducting sheet or a columnar conducting portion (not shown). The electrical connector 100 includes an insulating body 1. The insulating body 1 is internally formed with multiple accommodating holes 2. A conductor 3 is accommodated in each of the accommodating holes 2.

Specifically, the conductor 3 in this embodiment includes an elastic insulator 31. An upper end and lower end of the elastic insulator 31 slightly protrude from the accommodating hole 2. The elastic insulator 31 is a large elliptical particle made of a silicon rubber material, has good elasticity, and may be deformed when being pressed by the chip module 200 and the circuit board 300, as shown in FIG. 2 and FIG. 3. Alternatively, the elastic insulator 31 may also be in a ball shape, a cylinder shape or another irregular shape. The elastic insulator 31 may be arranged into interference fit with the hole wall of the accommodating hole 2, or a holding portion (not shown) is arranged on the elastic insulator 31 and fit with a holding slot (not shown in the drawing) in the accommodating hole 2, so that the elastic insulator 31 can be stably accommodated in the accommodating hole 2. The conductor 3 according to certain embodiments of the present invention has good elasticity, so that the conductor 3 can be assembled into the accommodating hole 2 of the insulating body 1. In another embodiment, plastic may also be poured around the conductor 3 to form the insulating body 1. In this embodiment, the hole diameter of the bottom of the accommodating hole 2 is tapering to form a hooking portion 20. The hooking portion 20 is hooked to the conductor 3, and may prevent the conductor 3 from retreating from the accommodating hole 2.

The elastic insulator 31 has a rough outer surface, and the outer surface thereof is provided with some grooves or cavities, as shown by the reference number 311. The elastic insulator 31 is internally doped with a conducting substance D which may form an alloy with gallium metal, further strengthening the conducting effect of the conductor 3.

In this embodiment, the entire outer surface of the elastic insulator 31 is coated with a layer of low melting point liquid metal A. The liquid metal A forms a continuous conducting path on the outer surface of the elastic insulator 31. In one embodiment, the melting point of the low melting point liquid metal A used in the present invention is less than 40° C. For example, single element gallium metal whose melting point is about 29.76° C. may be used. Alternatively, a gallium alloy may also be used. For example, a binary alloy of indium and gallium at a proportion of 24.5:75.5 has a melting point of about 15.7° C. Further, a ternary alloy with a proportion of indium-gallium-tin of 20.5:66.5:13.0 has a melting point about 10.7° C. A user may use gallium metal, or an alloy prepared by using of indium, gallium, tin and another metal according to a proportion, so that at a normal or room temperature, the gallium metal or the gallium alloy is in a form of liquid. The impedance of the liquid metal A is small. Thus, during current transmission, no or little energy is consumed due to the low impedance, thereby ensuring stable current transmission and good electrical connection effect.

In order to prevent liquid metal A in neighboring accommodating holes 2 from being short-circuited, the upper surface and the lower surface of the insulating body 1 may be each provided with a covering layer 5. The covering layer 5 may be made of an elastic and insulating silicon rubber material. The thickness of the covering layer 5 is very small. A location of the covering layer 5 corresponding to each of the accommodating holes 2 is provided with a perforation 50. The size of the perforation 50 is less than the diameter of the accommodating hole 2, and the maximal diameter of the elastic insulator 31 is greater than the maximal diameter of the perforation 50.

As shown in FIG. 2 and FIG. 3, the conductor 3 is in compression contact with the chip module 200 and the circuit board 300 respectively. When the chip module 200 is pressed downward, the upper end and the lower end of the elastic insulator 31 are pressed by the chip module 200 and the circuit board 300 respectively. The elastic insulator 31 can be elastically deformed very well in the accommodating hole 2, and the tin ball B can contact the liquid metal A on the surface of the elastic insulator 31. Moreover, a large contact area exists between the liquid metal A and the tin ball B, so the contact impedance may be further reduced. The outer surface of the elastic insulator 31 is rough, and the liquid metal A also exists in the groove or cavity 311 on the outer surface, so the quantity of the liquid metal A is increased. It may be ensured that the quantity of the liquid metal A on the surface of the elastic insulator 31 is not greatly reduced due to multiple times of compression connection (which is taken away due to adhesion of the tin ball B or the liquid metal A is extruded and flows to a location which is not pressed), so the service life of the electrical connector 100 may be prolonged. The covering layer 5 may isolate the liquid metal A in the neighboring accommodating holes 2, so as to prevent neighboring conductors 3 from being short-circuited.

Figure 4D:
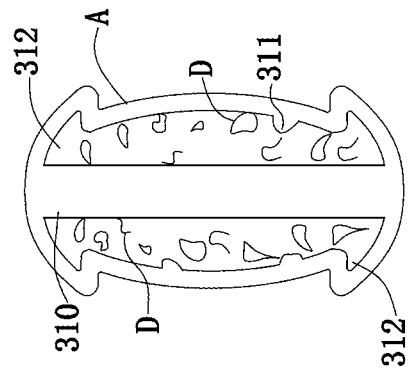
FIGS. 4A-4D show schematically variant forms of a conductor capable of implementing certain embodiments of the present invention.
Figure 4C:
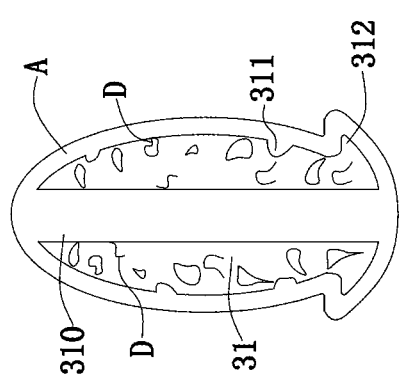
Figure 4B:
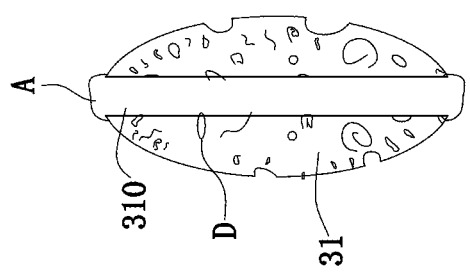
Figure 4A:
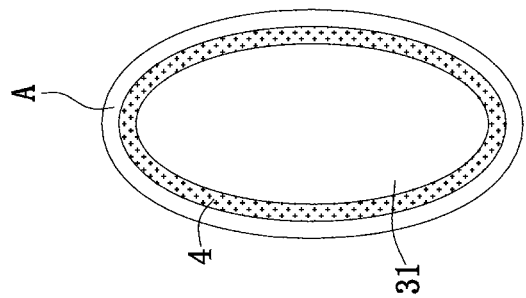

The conductor 3 may also be in the shape shown in FIGS. 4A-4D. As shown in FIG. 4A, in order to enable the liquid metal A, namely, the gallium metal or gallium alloy to be more securely attached onto the elastic insulator 31, the surface of the elastic insulator 31 is firstly provided with a metal layer 4 which is easily immersed by the liquid metal A. For example, the outer surface of the elliptical elastic insulator 31 may be firstly plated with a tin layer, and then the liquid metal A is coated on the outer surface of the tin layer. In this way, the liquid metal A can be stably attached on the surface of the tin layer, and the tin layer itself is securely positioned on the outer surface of the elastic insulator 31, so the liquid metal A can wholly be securely positioned on the outer surface of the elastic insulator 31, and does not easily fall off, so as to implement the stable electrical connection function. As shown in FIG. 4B, only outer surfaces of the upper end and the lower end of the elastic insulator 31 are wrapped with some liquid metal A, the central part is provided with a through-hole 310, the through-hole 310 is filled with the liquid metal A, and the liquid metal A is formed with a continuous conducting path in the through-hole 310. Likewise, the elastic insulator 31 is internally doped with a conducting substance D, and when the liquid metal A is single element gallium metal, the conducting substance D may react with the single element gallium metal in the through-hole 310 to form a liquid alloy. As shown in FIG. 4C, the lower end of the elastic insulator 31 protrudes from the lower surface of the insulating body 1. The size of a protruding portion 312 is greater than that of an opening of the accommodating hole 2. The protruding portion 312 may be correspondingly locked to the lower surface of the insulating body 1, so as to prevent the conductor 3 from shaking up and down in the accommodating hole 2. The entire outer surface of the elastic insulator 31 is wrapped with the liquid metal A to form a continuous conducting path. The central part of the elastic insulator 31 is provided with a through-hole 310 which passes through from top to bottom. The through-hole 310 is filled with the liquid metal A. The liquid metal A in the through-hole 310 forms another continuous conducting path. Likewise, the elastic insulator 31 is internally doped with the conducting substance D, and when the liquid metal A is single element gallium metal, the conducting substance D may react with the single element gallium metal in the through-hole 310 and on the outer surface of the elastic insulator 31 to form a liquid alloy. As shown in FIG. 4D, both the upper end and the lower end of the elastic insulator 31 are arranged to protrude from the upper surface and the lower surface of the insulating body 1 respectively, and the size of a protruding portion 312 is greater than that of an opening of the accommodating hole 2. Alternatively, in another embodiment, only the surface of the hole wall of the through-hole 310 may be provided with a layer of liquid metal A (the through-hole 310 is not entirely filled by the liquid metal A). In another word, for the conductor 3 of the present invention, the liquid metal A may be arranged on the outer surface of the elastic insulator 31, or may be arranged on the internal surface of the elastic insulator 31, the liquid metal A may be arranged to wholly wrap the outer surface or internal surface, or may be arranged to partially wrap the outer surface or internal surface, as long as it is ensured that the liquid metal A on the elastic insulator 31 forms a continuous conducting path between the chip module 200 and the circuit board 300.

Figure 5:
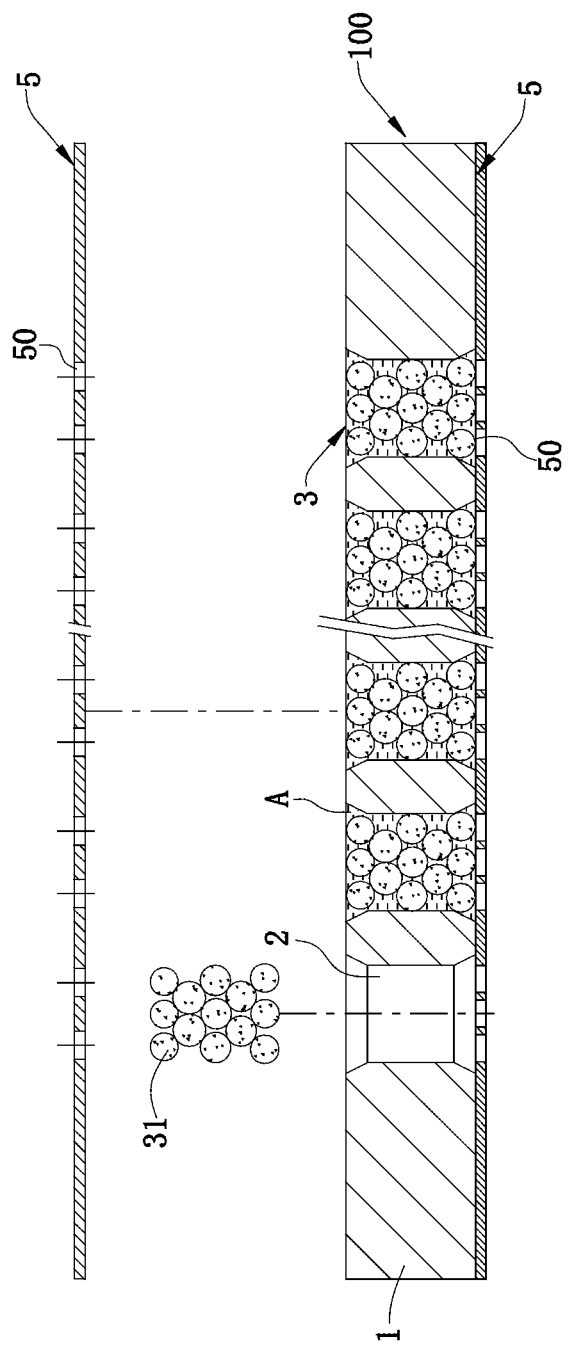
FIG. 5 is a schematic exploded view of an electrical connector according to a second embodiment of the present invention.
Figure 6:
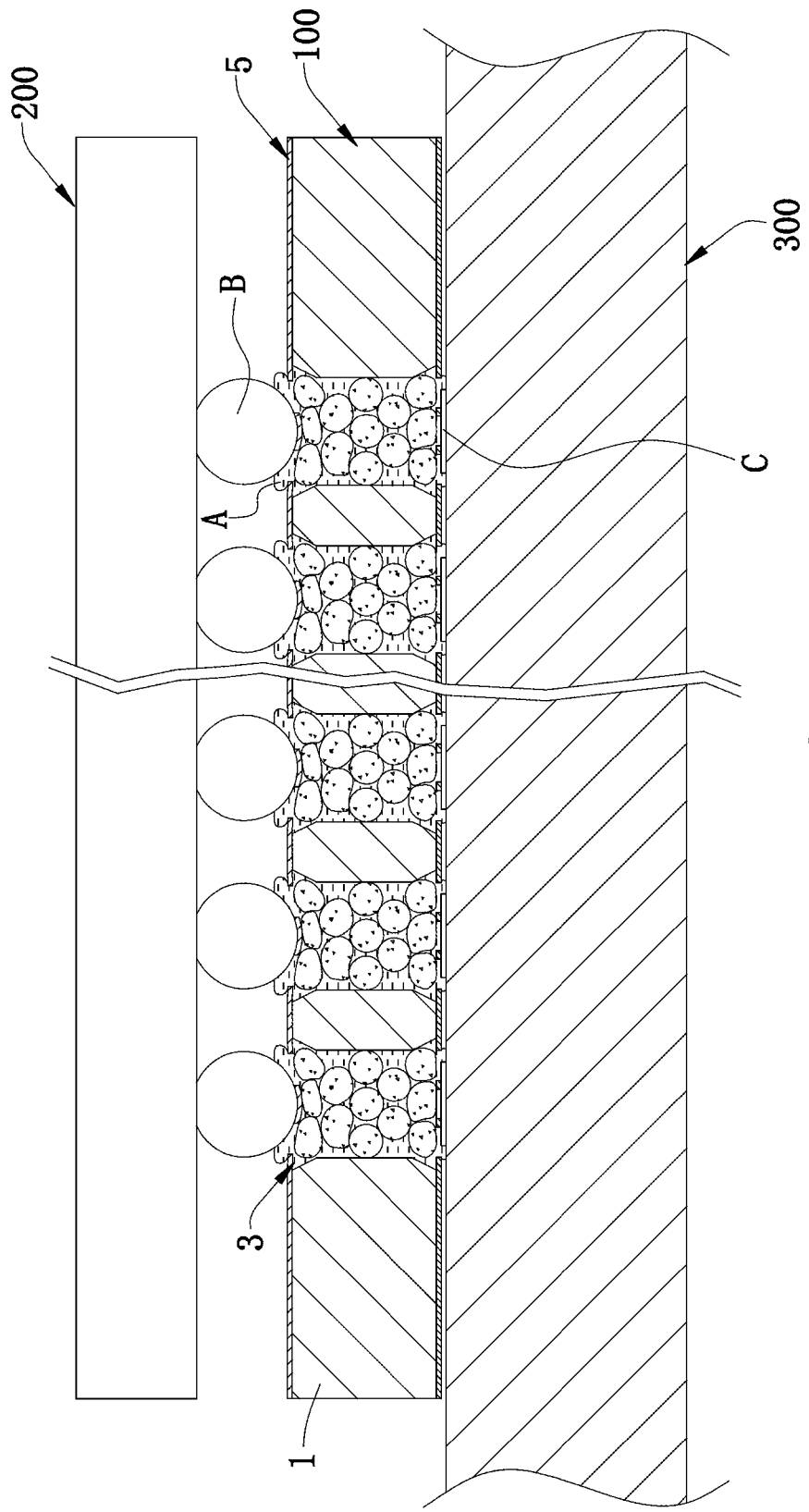
FIG. 6 is a schematic diagram when the electrical connector in FIG. 5 is connected to a chip module and a circuit board.

FIGS. 5 and 6 show a second embodiment of the present invention. An electrical connector 100 includes an insulating body 1 provided with multiple accommodating holes 2. A conductor 3 is accommodated in each of the accommodating holes 2. The conductor 3 includes multiple elastic insulators 31. Low melting point liquid metal A is arranged on a surface of each of the elastic insulators 31, and liquid metal A on outer surfaces of all the elastic insulators 31 in the same conductor 3 is in communication with each other. Specifically, each of the accommodating holes 2 is internally provided with a certain quantity of liquid metal A, and the liquid metal A is filled with multiple silicon rubber particles which are tiny and have good elasticity. By use of cheap silicon rubber particles as fillers, the quantity of the liquid metal A used may be reduced, so as to effectively reduce the cost. Moreover, by use of surfaces of multiple tiny silicon rubber particles, the liquid metal A may be effectively adsorbed, so that the liquid metal A does not flow out of the accommodating hole 2 greatly.

Further, in order to prevent the liquid metal A from flowing out of the accommodating hole 2, the upper surface and the lower surface of the insulating body 1 may be each provided with a covering layer 5. The covering layer 5 may be made of an elastic and insulating silicon rubber material. The thickness of the covering layer 5 is very small. A location of the covering layer 5 corresponding to the accommodating hole 2 is provided with multiple perforations 50. The size of these perforations 50 is far less than the diameter of the accommodating hole 2. In order to prevent the silicon rubber particles from leaking from the perforations 50, the diameter of the silicon rubber particles may be set to be greater than the diameter of the perforations 50. A piece of gauze having tiny holes may also be used as the covering layer 5. When the electrical connector 100 is not pressed by the chip module 200, the liquid metal A is stably attached to the surface of the silicon rubber particles, and does not fall off from the perforations 50.

In this embodiment, the liquid metal A may be made of a material basically the same as that in the first embodiment. Specifically, the bottom of the insulating body 1 may be firstly provided with a covering layer 5. Next, multiple tiny silicon rubber particles are placed in the accommodating hole 2. Then the liquid metal A is placed in the accommodating hole 2, so that the liquid metal A fills the entire accommodating hole 2. Finally the top of the insulating body 1 is provided with another covering layer 5.

As shown in FIG. 6, when the chip module 200 is pressed on the electrical connector 100, the covering layers 5 on the upper and lower surfaces of the insulating body 1 may both be elastically deformed, and the silicon rubber particles in the accommodating hole 2 are also extruded and deformed. In this case, the liquid metal A in the accommodating hole 2 is extruded, so a small part of the liquid metal A in the accommodating hole 2 is exposed out of the perforation 50 of the covering layer 5. The exposure quantity is very small, so the exposed part of the liquid metal A is attached out of the perforation 50 due to the surface tension, and connected to the liquid metal A in the accommodating hole 2. Moreover, the part of the liquid metal A electrically contacts a tin ball B of the chip module 200 and a conducting pad C on the circuit board 300 respectively. In this way, the liquid metal A is formed with a continuous conducting path between the chip module 200 and the circuit board 300, and the electrical connector 100 implements compression contact with the chip module 200 and the circuit board 300.

In order to ensure that the liquid metal A can be securely attached onto the silicon rubber particles, a tin layer may also be plated on the surface of the silicon rubber particles, as shown in the first embodiment.

As another implementation manner (not shown), the conductor 3 is made of a foaming material immersed with the liquid metal A. An internal interval of the foaming material is filled with the liquid metal A, and the outer surface of the foaming material is wrapped with liquid metal A in communication with the internal liquid metal A. The foaming material may be foam or foaming silica gel. In addition, the foam or foaming silica gel may be further internally doped with another conducting substance which may form a liquid alloy with gallium metal.

Compared with the related art, certain embodiments of the present invention have the following beneficial advantages.

1. The outer surface of the elastic insulator 31 is provided with the low melting point liquid metal A, and a continuous conducting path is formed between the chip module 200 and the circuit board 300 by use of the liquid metal A. Thus, it is ensured that the conductor 3 has good elasticity, the phenomenon that the conducting path is disconnected due to being pressed by the chip module 200 may be avoided, and the stable electrical connection between the chip module 200 and the circuit board 300 is ensured. Moreover, electrical transmission is performed by use of the liquid metal A, and the impedance of the liquid metal A is small, which can effectively reduce the impedance of the electrical connector 100, ensure normal current transmission, and provide a clear and stable communication effect.

2. The liquid metal A is filled with multiple silicon rubber particles, and cheap silicon rubber particles are used as fillers. Thus the quantity of the liquid metal A used may be reduced, and the cost may be reduced effectively. Moreover, the liquid metal A may be effectively adsorbed by the surface of multiple tiny silicon rubber particles, so that the liquid metal A does not flow out of the accommodating hole 2 greatly.

3. The covering layers 5 on the upper surface and the lower surface of the insulating body 1 can effectively prevent the liquid metal A from flowing out of the accommodating hole 2, and liquid metal A in neighboring accommodating holes 2 may be further prevented from being short-circuited to a certain extent. The perforations 50 are formed on the covering layer 5. The size of these perforations 50 is very small, and the diameter of the perforations 50 is less than the diameter of the silicon rubber particles, so it may be ensured that the silicon rubber particles are stably placed in the accommodating hole 2. Moreover, when the liquid metal A is pressed by the chip module 200 and the circuit board 300, a part of the liquid metal A is exposed from the perforation 50, so the exposed part of the liquid metal A electrically contacts the tin ball B of the chip module 200 and the conducting pad C on the circuit board 300, thereby ensuring that with a continuous conducting path is formed by the liquid metal A between the chip module 200 and the circuit board 300.

4. The surface of the elastic insulator 31 is provided with a metal layer 4 which is easily immersed by the liquid metal A, so the liquid metal A can be more securely attached onto the elastic insulator 31, so as to ensure that a continuous conducting path is formed by the liquid metal A between the chip module 200 and the circuit board 300.

5. The outer surface of the elastic insulator 31 is rough, and the outer surface thereof is provided with some grooves or cavities 311, so the quantity of the liquid metal A is increased, which may ensure that the quantity of the liquid metal A on the surface of the elastic insulator 31 is not greatly reduced due to multiple times of compression connection, and therefore the service life of the electrical connector 100 may be prolonged.

6. The elastic insulator 31 is internally doped with the conducting substance D which may form an alloy with the gallium metal, so the conducting sectional area of the entire conductor 3 is increased, which may further strengthen the conducting effect of the conductor 3.

7. The size of the protruding portion 312 of the elastic insulator 31 protruding from the surface of the insulating body 1 is greater than that of an opening of the accommodating hole 2, so the protruding portion 312 may be correspondingly locked to the lower surface of the insulating body 1, and can prevent the conductor 3 from shaking up and down in the accommodating hole 2, so that the conductor 3 is more stably accommodated in the accommodating hole 2.

8. The tapering hooking portion 20 at the bottom of the accommodating hole 2 may further prevent the conductor 3 from retreating from the accommodating hole 2.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a first electronic element to a second electronic element, comprising:
    an insulating body having a plurality of accommodating holes passing through two opposite side surfaces of the insulating body, each of the accommodating holes having a first side and an opposite, second side respectively disposed at the two opposite side surfaces of the insulating body; and
    a plurality of conductors, each accommodated in a corresponding accommodating hole,
    wherein each conductor comprises an elastic insulator having a groove or a cavity on a surface thereof and low melting point liquid metal wrapping the surface of the elastic insulator, a first end of the conductor is protruded from the first side of the corresponding accommodating hole, a second end, opposite to the first end, of the conductor is exposed from the second side of the corresponding accommodating hole,
    when the first electronic element compresses the first ends of the conductors, the second ends of the conductors urge the second electronic element, such that the liquid metal contacts the first electronic element and the second electronic element.

2. The electrical connector according to claim 1, wherein the second end of the conductor is protruded from the second side of the corresponding accommodating hole.

3. The electrical connector according to claim 1, wherein the conductor is made of a foaming material immersed with the liquid metal, an internal interval of the foaming material is filled with the liquid metal, and the liquid metal wrapping a surface of the foaming material and the liquid metal filled in the internal interval of the foaming material are in communication with each other.

4. The electrical connector according to claim 3, wherein the foaming material is foam or foaming silica gel.

5. The electrical connector according to claim 1, wherein the elastic insulator is a silicon rubber particle.

6. The electrical connector according to claim 1, further comprising a covering layer disposed on at least one surface of the insulating body, wherein at least one perforation is formed at a location of the covering layer corresponding to the accommodating hole, a diameter of the perforation is less than a diameter of the accommodating hole, and a part of the liquid metal is exposed from the perforation to contact the first electronic element or the second electronic element.

7. The electrical connector according to claim 6, wherein a diameter of the elastic insulator is greater than the diameter of the perforation.

8. The electrical connector according to claim 1, wherein the liquid metal is coated on the surface of the elastic insulator to form the conducting path.

9. The electrical connector according to claim 1, wherein the liquid metal is gallium metal or a gallium alloy.

10. The electrical connector according to claim 1, wherein the conductor is in compression contact with the first electronic element and the second electronic element separately.

11. The electrical connector according to claim 1, wherein the surface of the elastic insulator is provided with a metal layer easily immersed by the liquid metal, and the liquid metal is arranged on a surface of the metal layer.

12. The electrical connector according to claim 11, wherein the metal layer is a tin layer.

13. The electrical connector according to claim 1, wherein a melting point of the liquid metal is less than 40° C.

14. The electrical connector according to claim 1, wherein the elastic insulator has at least one through-hole, and the conducting path is formed by the liquid metal in the through-hole.

15. The electrical connector according to claim 1, wherein a conducting substance is doped in the elastic insulator.

16. The electrical connector according to claim 15, wherein the conducting substance is capable of forming an alloy with gallium.

17. The electrical connector according to claim 1, wherein one end of the accommodating hole is provided with a tapering hooking portion, and the hooking portion is hooked to the conductor.

18. The electrical connector according to claim 1, wherein the elastic insulator has a protruding portion protrudes from at least one surface of the insulating body.

19. The electrical connector according to claim 18, wherein the size of the protruding portion of the elastic insulator is greater than that of an opening of the accommodating hole.

* * * * *